(12) United States Patent
Park

(10) Patent No.: US 9,470,370 B2
(45) Date of Patent: Oct. 18, 2016

(54) LIGHT EMITTING MODULE AND LIGHT EMITTING DEVICE HAVING THE SAME

(71) Applicant: LG INNOTEK CO., LTD., Seoul (KR)

(72) Inventor: Jun Seok Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 128 days.

(21) Appl. No.: 14/302,937

(22) Filed: Jun. 12, 2014

(65) Prior Publication Data

US 2014/0369044 A1    Dec. 18, 2014

(30) Foreign Application Priority Data

Jun. 13, 2013    (KR) .................. 10-2013-0067825

(51) Int. Cl.

| | |
|---|---|
| *F21K 99/00* | (2016.01) |
| *F21V 23/00* | (2015.01) |
| *F21V 23/06* | (2006.01) |
| *H01L 33/62* | (2010.01) |
| *F21V 19/00* | (2006.01) |
| *H01L 25/075* | (2006.01) |
| *F21Y 101/02* | (2006.01) |
| *F21Y 103/00* | (2016.01) |
| *F21Y 105/00* | (2016.01) |

(52) U.S. Cl.
CPC ............... *F21K 9/10* (2013.01); *F21V 23/002* (2013.01); *F21V 23/06* (2013.01); *H01L 33/62* (2013.01); *F21V 19/001* (2013.01); *F21Y 2101/02* (2013.01); *F21Y 2103/003* (2013.01); *F21Y 2105/001* (2013.01); *H01L 25/0753* (2013.01); *H01L 2224/48091* (2013.01); *H01L 2224/48247* (2013.01)

(58) Field of Classification Search
CPC .. F21V 23/002; F21V 19/001; F21V 19/002; F21V 23/06; F21V 21/005; F21V 23/001; H01L 33/62; H01L 2224/48091; H01L 33/48; H01L 2224/47; H01L 2224/48; H01L 2224/48247; H01L 2924/00014; H01L 25/0753; H01L 2924/00; F21Y 2101/02; F21Y 2105/001; F21Y 2103/003; F21K 9/10
See application file for complete search history.

(56) References Cited

U.S. PATENT DOCUMENTS

| | | | | |
|---|---|---|---|---|
| 7,821,020 | B2 * | 10/2010 | Park ..................... | H01L 33/58 257/100 |
| 8,702,294 | B2 * | 4/2014 | Lee ..................... | G02B 6/0073 362/249.02 |
| 9,362,469 | B2 * | 6/2016 | Park ..................... | H01L 33/56 |
| 2003/0193803 | A1 | 10/2003 | Lin | |
| 2009/0236617 | A1 | 9/2009 | Ku | |
| 2011/0241028 | A1 | 10/2011 | Park et al. | |
| 2011/0249469 | A1 | 10/2011 | Lee et al. | |

* cited by examiner

*Primary Examiner* — Bao Q Truong
(74) *Attorney, Agent, or Firm* — Birch, Stewart, Kolasch & Birch, LLP

(57) ABSTRACT

Disclosed are a light emitting module and a light emitting device. The disclosed light emitting module includes a plurality of light emitting devices and a wire connecting the light emitting devices with each other and having at least a first end portion coupled with each light emitting device. The wire has a length longer than a distance between the light emitting devices, and is located higher than bottom surfaces of the light emitting devices. Each light emitting device includes a body including an insulating material, a first lead frame making contact with the body and having a first coupling part, a second lead frame making contact with the body and having a second coupling part, and a light emitting chip on at least one of the first and second lead frames. The first and second coupling parts are located higher than the bottom surfaces of the light emitting devices, and the wire is coupled with the first and second coupling parts of the light emitting devices.

20 Claims, 9 Drawing Sheets

LIGHT EMITTING MODULE AND LIGHT EMITTING DEVICE HAVING THE SAME

The present application claims priority under 35 U.S.C. §119(a) of Korean Patent Application No. 10-2013-0067825 filed on Jun. 13, 2013, which is hereby incorporated by reference in its entirety.

BACKGROUND

The embodiment relates to a light emitting module and a light emitting device having the same.

In general, a circuit board is formed by forming a circuit pattern on an electrical insulating substrate using a conductive material such as copper, and refers to a substrate before a heating emitting device related to electronic components is mounted thereon. Such a circuit board is provided thereon with a plurality of light emitting diodes (LED).

A light emitting device, for example, a light emitting diode (LED), which is a kind of a semiconductor device to convert electrical energy into light, has been spotlighted as a next-generation light source in substitution for a conventional fluorescent lamp and a glow lamp.

Since the LED generates the light by using the semiconductor device, the LED may represent significantly low power consumption as compared with the glow lamp that generates the light by heating tungsten or the fluorescent lamp that generates the light by urging ultraviolet ray, which is generated through the high-voltage discharge, to collide with a fluorescent substance.

In addition, since the LED generates the light by using the potential gap of the semiconductor device, the LED represents a longer life span, a rapider response characteristic, and a more eco-friendly feature as compared with those of a convention light source.

In this regard, various studies have been performed to substitute the conventional light source with the LEDs. The LEDs are increasingly used as light sources for lighting devices, such as various lamps used indoors and outdoors, liquid crystal displays, electric signboards, and street lamps.

Although a plurality of LEDs have been arranged on the circuit board, the circuit board must be additionally prepared in order to connect the LEDs to each other.

SUMMARY

The embodiment provides a light emitting module having a novel structure.

The embodiment provides a light emitting module in which light emitting devices adjacent to each other are connected to each other by a wire.

The embodiment provides a light emitting module in which light emitting devices adjacent to each other are directly connected to each other by a wire and are not electrically connected through a circuit board.

According to the embodiment, there is provided a light emitting module including a plurality of light emitting devices, and a wire connecting the light emitting devices with each other and having at least a first end portion coupled with each light emitting device, wherein the wire has a length longer than a distance between the light emitting devices, and is located higher than bottom surfaces of the light emitting devices, each light emitting device comprises: a body including an insulating material; a first lead frame contacted with the body and having a first coupling part; a second lead frame contacted with the body and having a second coupling part; and a light emitting chip disposed on at least one of the first and second lead frames, the first and second coupling parts are located higher than the bottom surfaces of the light emitting devices, and the wire is coupled with the first and second coupling parts of the light emitting devices.

According to the embodiment, there is provided a light emitting module including a plurality of light emitting devices, a wire connecting the light emitting devices with each other and having at least a first end portion coupled with each light emitting device, and an insulating sheet under the light emitting devices, wherein the wire has a length longer than a distance between the light emitting devices, and is located higher than bottom surfaces of the light emitting devices, each light emitting device comprises: a body including an insulating material; a first lead frame contacted with the body and having a first coupling part; a second lead frame contacted with the body and having a second coupling part; and a light emitting chip disposed on at least one of the first and second lead frames, the first and second coupling parts are located higher than the bottom surfaces of the light emitting devices, and the wire is coupled with the first and second coupling parts of the light emitting devices.

DETAILED DESCRIPTION OF THE EMBODIMENTS

Figure 1:
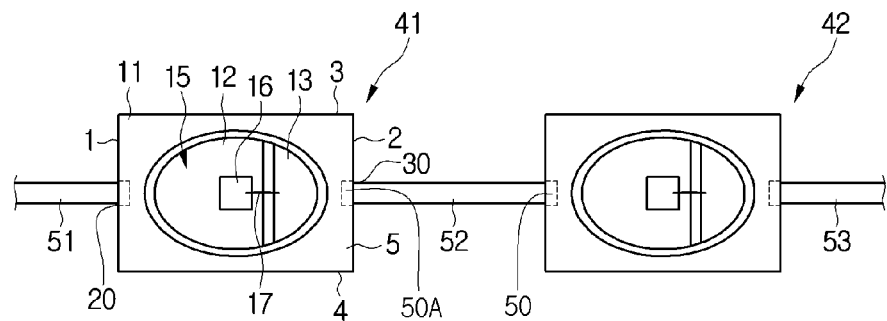
FIG. 1 is a plan view showing a light emitting module according to the first embodiment.

Hereinafter, embodiments will be described in detail with reference to accompanying drawings so that those skilled in the art can easily work with the embodiments. However, the embodiments may not be limited to those described below, but have various modifications. In addition, only components related to the embodiment are shown in drawings for the clarity of explanation. Hereinafter, the similar reference numerals will be assigned to the similar elements.

In the following description, when a predetermined part "includes" a predetermined component, the predetermined part does not exclude other components, but may further include other components if there is no specific opposite description.

In the description of the embodiments, it will be understood that, when each layer (film), region, pattern or structure is referred to as being "on" or "under" another layer (film), another region, another pad or another pattern, it can be "directly" or "indirectly" on the other layer (film), region, pad, or pattern, or one or more intervening layers may also be present. Such a position of the layer has been described with reference to the drawings.

Hereinafter, a light emitting module according to the embodiment will be described with reference to FIGS. 1 to 4.

Figure 2:
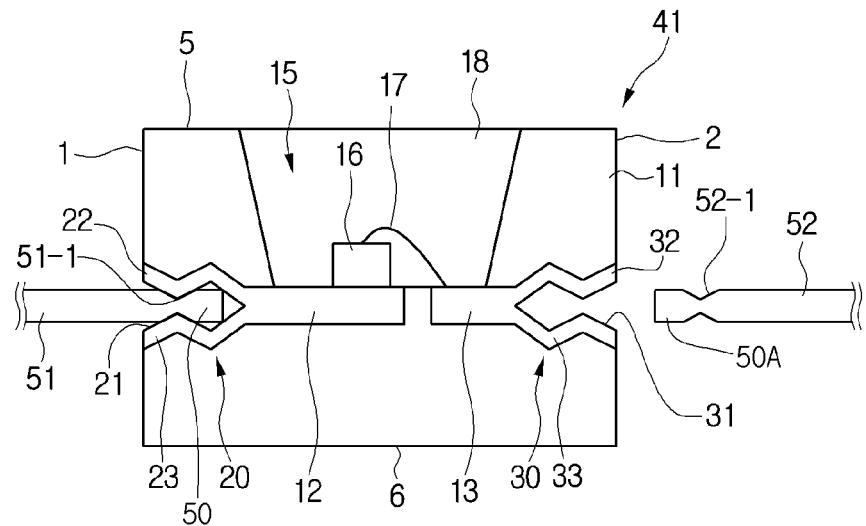
FIG. 2 is a side sectional view showing a coupling part of a light emitting device and a wire in the light emitting module shown in FIG. 1.
Figure 3:
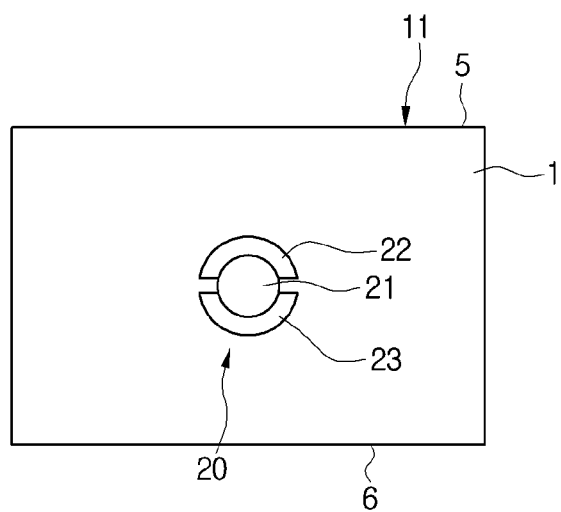
FIG. 3 is a first side view showing the light emitting device shown in FIG. 2.
Figure 4:
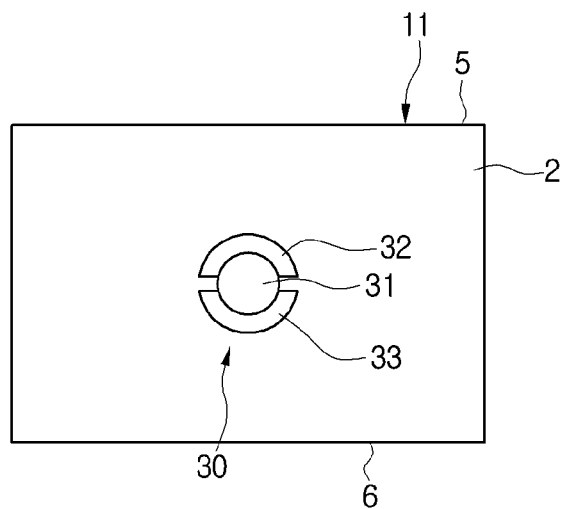
FIG. 4 is a second side view showing the light emitting device shown in FIG. 2.

FIG. 1 is a plan view showing a light emitting module according to the first embodiment. FIG. 2 is a side sectional view showing a coupling part of a light emitting device and a wire in the light emitting module shown in FIG. 1. FIG. 3 is a first side view showing the light emitting device shown in FIG. 2. FIG. 4 is a second side view showing the light emitting device shown in FIG. 2.

Referring to FIGS. 1 to 4, a light emitting module 10 includes a plurality of light emitting devices 41 and 42 and wires 51, 52, and 53 to connect the plurality of light emitting devices 41 and 42 with each other. The light emitting module 10 may include a support member, for example, an insulating sheet (not shown) provided under the plurality of light emitting devices 41 and 42.

In the light emitting module 10, the light emitting devices 41 and 42 may be connected with each other by using the wires 51, 52, and 53. For example, the two adjacent light emitting devices 41 and 42 are connected with both end portions 50 and 50A of at least one wire 52. In other words, the two adjacent light emitting devices 41 and 42 may be connected with each other by at least one wire 52. A printed circuit board (PCB) may not be provided under the light emitting devices 41 and 42, and the light emitting devices 41 and 42 may not be electrically connected with the PCB under the light emitting devices 41 and 42. In addition, the PCB may not extend under a region between the light emitting devices 41 and 42. The wires 51, 52, and 53 have lengths longer than the distance between the light emitting devices 41 and 42, and are located higher than bottom surfaces of the light emitting devices 41 and 42. The distance between the light emitting devices 41 and 42 represents the distance between the two adjacent light emitting devices 41 and 42.

Referring to FIGS. 1 and 2, each of the light emitting devices 41 and 42 includes a body 11, a cavity 15 in the body 11, a plurality of lead frames 12 and 13 disposed in the cavity 15, coupling parts 20 and 30 connected with the lead frames 12 and 13, a light emitting chip 16 disposed on at least one of the lead frames 12 and 13, and a molding member 18 in the cavity 15.

The body 11 may include an insulating material, such as silicon, epoxy, or a resin material such as polyphthalamide (PPA). The body 11 includes metallic oxide, such as $SiO_2$, $SixOy$, $Si_3N_4$, $Si_xN_y$, $SiO_xN_y$, or $Al_2O_3$, or ceramic material, such as AlN, $Al_2O_3$, low temperature co-fired ceramic (LTCC), or high temperature co-fired ceramic (HTCC).

According to another example, the body 11 may selectively include acid anhydride, an antioxidant, a release agent, an optical reflector, an inorganic filling agent, a curing catalyst, a light stabilizer, a lubricant, or a titanium dioxide. The body 11 may be molded by using at least one selected from the group consisting of epoxy resin, modified epoxy resin, silicon resin, modified silicon resin, acrylic resin, and urethane resin. For example, the body 11 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU (1.8-Diazabicyclo(5,4,0)undecene-7) serving as a hardening accelerator and ethylene glycol, titanium oxide pigment or glass fiber serving as a promoter to the epoxy resin, but the embodiment is not limited thereto. The body 11 may include a white-based resin by the metallic oxide.

The body 11 includes first and second lateral sides 1 and 2 opposite to each other and third and fourth lateral sides 3 and 4 adjacent to the first and second lateral sides 1 and 2 and opposite to each other. The first and second lateral sides 1 and 2 may have lengths equal to or greater than those of the third and fourth lateral sides 3 and 4. The body 11 includes an upper portion disposed on the lead frames 12 and 13 and a lower portion disposed under the lead frames 12 and 13, and the thickness of the lower portion may be thinner than the thickness of the upper portion.

The body 11 may include the cavity 15 to open a portion of the upper portion. The cavity 5 may have the shape concave from the top surface of the body 11, and is a region to output light. The cavity 15 may include the light emitting chip 16 and the lead frames 12 and 13. For example, the cavity 15 may be formed in the injection molding process of the body 11, or additionally formed through an etching process, but the embodiment is not limited thereto.

A side sectional shape of the cavity 15 may include a shape in which a lower portion of the cavity 15 has a narrow width and an upper portion of the cavity 15 has a wide width, or a shape in which the lower and upper portions of the cavity 15 have equal widths. The lateral side of the cavity 15 may be perpendicular to a bottom surface of the cavity 15 or may be inclined with respect to the bottom surface of the cavity 15. The top view shape of the cavity 15 may include at least one of a circular shape, an oval shape, a polygonal shape, and atypical shape. The upper portion of the body 11 may have no cavity 15.

A plurality of lead frames, for example, the first and second lead frames 12 and 13 are coupled with each other in the body 11. The first and second lead frames 12 and 13 may include outer parts coupled with the body 11 and inner parts exposed in the cavity 15. The first and second lead frames 12 and 13 are electrically isolated from each other in the cavity 15. The first and second lead frames 12 and 13 may be electrically connected with the light emitting chip 16 disposed in the cavity 15 to supply power to the light emitting chip 16. The light emitting chip 16 may include one light emitting chip or a plurality of light emitting chips. For example, the light emitting chips 16 may be disposed on one of the first and second lead frames 12 and 13 or on mutually different lead frames.

At least one of the first and second lead frames 12 and 13 may be disposed under the light emitting chip 16, and the light emitting chip 16 may be connected with the first lead frame 12 through a connection member 17, and electrically connected with the first and second lead frames 12 and 13. According to another example, the connection member 17 may be individually connected with the light emitting chip 16 and the first and second lead frames 12 and 13. According to another example, the light emitting chip 16 may be bonded onto the first and second lead frames 12 and 13 through a flip-chip bonding scheme, but the embodiment is not limited thereto. The connection member 17 includes a wire. The connection member 17 may include a conductive material, for example, a metallic material. The connection member 17 includes at least one of gold (Au), silver (Ag), lead (Pb), iron (Fe), aluminum (Al), silicon (Si), and calcium (Ca). The connection member 17 includes the diameter of at least 0.5 mm or more.

Portions of the first and second lead frames 12 and 13 may be exposed to at least one of an outside and a bottom surface of the body 11. The first and second lead frames 12 and 13 may include a material representing electrical conductivity, and for example, may include at least one metal selected from the group consisting of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), and iron (Fe). In addition, the first and second lead frames 12 and 13 may be formed in a single layer structure or a multi-layer structure, but the embodiment is not limited thereto. The first and second lead frames 12 and 13 may have the thicknesses in the range of 0.5 mm to 3 mm, but the embodiment is not limited thereto. The first and second lead frames 12 and 13 may include a plating layer for the bonding with the connection member 17, and the plating layer may include one among materials constituting the connection member 17.

The first and second lead frames 12 and 13 are disposed higher than bottoms of the light emitting devices 41 and 42. The first and second lead frames 12 and 13 are spaced apart from a bottom surface 6 of the body 11. The entire regions of the first and second lead frames 12 and 13 are spaced apart from the bottom surface 6 of the body 11. A lower portion of the body 11 may be disposed under the first and second lead frames 12 and 13 so that the electrical connection through the low portion of the body 11 can be blocked. Accordingly, an additional circuit board may not be disposed on the bottom surface 6 of the body 11. According to another example, portions of the first and second lead frames 12 and 13 may be exposed to the bottom surface 6 of the body 11, and may serve as heat radiation parts instead of electrical connectors.

The light emitting chip 16 emits light having a peak wavelength in the range of a visible ray wavelength to an ultraviolet ray wavelength, and for example, may include at least one of a blue LED chip, a red LED chip, a green LED chip, and a white LED chip. The light emitting chip 16 includes a compound semiconductor including group III-V elements, and for example, includes a semiconductor material based on GaN, AlN, AlGaN, InGaN, InN, InAlGaN, AlInN, AlGaAs, GaP, GaAs, GaAsP, and AlGaInP, thereby emitting light representing the intrinsic color of a semiconductor material.

The molding member 18 may be formed to cover the light emitting chip 16, and may include a resin material, such as a silicon material or an epoxy material, having transparency. The molding member 18 may include phosphors. The molding member 18 may be formed in multiple layers with a resin layer having the phosphors in the cavity 15. A reflective member (not shown) may be additionally disposed on the molding member 18. The reflective member may reflect incident light in a side direction, and the body 11 may include a transparent material. A lens member (not shown) may be additionally disposed on the molding member 18, but the embodiment is not limited thereto.

The phosphors may include at least one of a green phosphor, a yellow phosphor, a red phosphor, and a green phosphor or phosphors including mutually different materials. The materials constituting the phosphor emit a visible ray by exciting the wavelength of light emitted from the LED chip. The phosphors may include at least one of a phosphor having a garnet-type crystal structure, a silicate phosphor, an oxide phosphor, a sulfide phosphor, an oxynitride phosphor, and a nitride phosphor. For example, the phosphors may include a phosphor, such as $Y_3Al_5O_{12}$:Ce, $(Y,Gd)_3Al_5O_{12}$:Ce, $Tb_3Al_3O_{12}$:Ce, $Ca_3Sc_2Si_3O_{12}$:Ce, or $Lu_2CaMg_2(Si,Ge)_3O_{12}$:Ce, having a garnet-type crystal structure, a silicate phosphor, such as $(Sr,Ba)_2SiO_4$:Eu, $Ca_3SiO_4Cl_2$:Eu, $Sr_3SiO_5$:Eu, $Li_2SrSiO_4$:Eu, or $Ca_3Si_2O_7$:Eu, an oxynitride phosphor including an aluminate phosphor, such as $CaAl_{12}O_{19}$:Mn, or $SrAl_2O_4$:Eu, a sulfide phosphor, such as ZnS:Cu,Al, CaS:Eu, $CaGa_2S_4$:Eu, or $SrGa_2S_4$:Eu, an oxynitride phosphor such as $CaSi_2O_2N_2$:Eu, $SrSi_2O_2N_2$:Eu, $BaSi_2O_2N_2$:Eu, or Ca-α-SiAlON, or a nitride phosphor such as $CaAlSiN_3$:Eu, or $CaSi_5N_8$:Eu.

The light emitting devices 41 and 42 include the first and second coupling parts 20 and 30 disposed in the body 11. The first and second lead frames 12 and 13 include the first and second coupling parts 20 and 30, respectively. The first coupling part 20 may be coupled with the first lead frame 12, and the second coupling part 30 may be coupled with the second lead frame 13. The first and second coupling parts 20 and 40 are disposed in opposition to each other with reference to the light emitting chip 16.

The first coupling part 20 may be contacted with the body 11 while extending from the first lead frame 12 to a first lateral side 1 of the body 11. The second coupling part 30 may be contacted with the body 11 while extending from the second lead frame 13 to a second lateral side 2 of the body 11. The first and second coupling parts 20 and 30 may not be spaced apart from the cavity 15, or may not be exposed to the cavity 15. Portions of the first and second coupling parts 20 and 30 may be exposed to the opposite lateral sides 1 and 2 among lateral sides 1 to 4 of the body 11. According to another example, the portions of the first and second coupling parts 20 and 30 may be disposed at mutually opposite lateral sides 3 and 4 or mutually adjacent lateral sides 1 and 3 or 2 and 4.

The first coupling part 20 may be integrally formed with the first lead frame 12, and the second coupling part 30 may be integrally formed with the second lead frame 13.

As shown in FIGS. 1 and 3, the first coupling part 20 extends from the first lead frame 12, and may be exposed to the first lateral side 1 of the body 11. The first coupling part 20 may be exposed to the first lateral side 1 between the top surface 5 and the bottom surface 6 of the body 11, and disposed higher than the bottom surface 6 of the body 11. The first coupling part 20 may not be exposed to the bottom surface 6 of the body 11, thereby preventing the electrical short failure at the bottom surface 6 of the body 11. The first coupling part 20 may be disposed at a portion of the first lateral side 1, for example, the central region of the first lateral side 1.

The first coupling part 20 includes a first insertion hole 21 having a predetermined depth from the first lateral side 1 of the body 11 and first contact parts 22 and 23 disposed on the first insertion hole 21. The first insertion hole 21 extends toward the first lead frame 12 or into the body 11 from the first lateral side 1 of the body 11. The first insertion hole 21 may be disposed between the first contact parts 22 and 23. The first contact parts 22 and 23 are formed by the first insertion hole 21. The first contact parts 22 and 23 are disposed at a region between the top surface 5 and the bottom surface 6 of the body 11.

The first contact parts 22 and 23 may include first and second parts 22 and 23 corresponding to each other. The first and second parts 22 and 23 branch to mutually different regions from the first lead frame 12. The first and second parts 22 and 23 of the first coupling part 20 may branch into at least two parts from an end portion the first lead frame 12, and for example, may branch in left/right directions corresponding to each other or up/down directions corresponding to each other. The first and second parts 22 and 23 may be formed by the first insertion hole 21. The first and second parts 22 and 23 may be formed in a concave-convex structure. Through the concave-convex structure, the contact area and the coupling force with the end portion of the first wire 51 may be increased. For example, the first coupling part 20 may be defined as a holder, hook, or connector.

One coupling part 20 or a plurality of coupling parts 20 may be formed in the first lead frame 12. For example, the coupling parts 20 may be disposed on the same lateral side or on mutually different lateral sides, but the embodiment is not limited thereto.

As shown in FIGS. 2 and 4, the second coupling part 30 extends from the inner part of the second lead frame 13, and may be exposed to the second lateral side 2 of the body 11. The second coupling part 30 may be disposed at the region between the top and bottom surfaces 5 and 6 of the body 11. In other words, the second coupling part 30 may be disposed higher than the bottom surface 6 of the body 11. The second coupling part 30 may not be exposed to the bottom surface 6 of the body 11, thereby preventing the electrical short defect at the bottom surface 6 of the body 11.

The second coupling part 30 includes a second insertion hole 31 having a predetermined depth from the second lateral side 2 of the body 11 and second contact parts 32 and 33 disposed on the second insertion hole 31. The second insertion hole 31 extends from the second lateral side 2 of the body 11 into the second contact parts 32 and 33, and disposed between the top surface 5 and the bottom surface 6 of the body 11. The second coupling part 30 may be disposed at a portion of the second lateral side 2, for example, at the central region of the second lateral side 2.

The second contact parts 32 and 33 include at least one part or at least two parts. For example, the second contact parts 32 and 33 include third and fourth parts 32 and 33. The third part 32 and the fourth parts 34 correspond to each other. The third part 32 and the fourth part 33 branch from the second lead frame 13 to mutually different regions. The third and fourth parts 32 and 33 of the second coupling part 30 may branch from the end portion of the second lead frame 13 to at least two parts, and for example, may branch in left/right directions corresponding to each other or up/down directions corresponding to each other. The third and fourth parts 32 and 33 may be formed by the second insertion hole 31. The third and fourth parts 32 and 33 may be formed in a concave-convex structure. Through the concave-convex structure, the contact area and a coupling force with the surface of the second wire 52 may be increased. For example, the second coupling part 30 may be defined as a holder, hook, or connector.

One second coupling part 30 or a plurality of coupling parts 30 may be formed in the second lead frame 13. For example, the second coupling parts 30 may be disposed on the same lateral side or on mutually different lateral sides, but the embodiment is not limited thereto.

Adjacent two light emitting devices 41 and 42 may be defined as the first and second light emitting devices 41 and 42. The first and second light emitting devices 41 and 42 are arranged adjacent to each other, and another light emitting device may not be disposed between the adjacent first and second light emitting devices 41 and 42. For the purpose of explanation, the first and second light emitting devices 41 and 42 may be defined by using adjacent devices. Although the embodiment has been described in terms of two light emitting devices, an example in which at least three light emitting devices may be included. The first and second light emitting devices 41 and 42 may be connected to each other by using at least one of wires 51, 52, and 53. The wires 51, 52, and 53 include a conductive material, for example, a metallic material. The wires 51, 52, and 53 include at least one of gold (Au), silver (Ag), lead (Pb), iron (Fe), aluminum (Al), silicon (Si), and calcium (Ca). The wires 51, 52, and 53 have diameters of at least 0.5 mm, for example, diameters in the range of 0.5 mm to 2 mm. If the diameters of the wires 51, 52, and 53 have a value lower than the range, the wires 51, 52, and 53 connected to the light emitting device may be separated from each other, and a force supported by the wires 51, 52, and 53 may be weakened. If the diameters of the wires 51, 52, and 53 are greater than the value in the range, the wires may be sufficiently bent in the connection between the light emitting devices. In addition, when the diameters of the wires 51, 52, and 53 are out of the range, handling is difficult in the manufacturing process of the package or the module.

The diameters of the wires 51, 52, and 53 may be smaller than or greater than the width of the top surface of the light emitting chip 16. The wires 51, 52, and 53 may include the same material as that of the connection member 17. The wires 51, 52, and 53 and the connection member 17 may have an equal diameter or different diameters. For example, the diameters of the wires 51, 52, and 53 may be greater than that of the connection member 17.

Each of the wires 51, 52, and 53 may have a first end portion 50 and a second end portion 50A defined at both ends thereof or at parts approximate to both ends thereof.

The first end portion 50 of the first wire 51 may be coupled with the first coupling part 20 of the first light emitting device 41. The first end portion 50 of the first wire 51 may be inserted into the first insertion hole 21 of the first coupling part 20 and may be contacted with the first contact parts 22 and 23. The first end portion 50 of the first wire 51 may be disposed between the first and second parts 22 and 23. The first end portion 50 of the first wire 51 may be disposed in the first insertion hole 21, and may be contacted with the first and second parts 22 and 23.

A second end portion of the first wire 51 may be coupled with another light emitting device or a connector. Due to the coupling structure, the circuit board may be omitted. In addition, even if the circuit board or the support substrate may be disposed, a process of additionally bonding the light emitting device with the circuit substrate or the support substrate may not be performed.

The second end portion 50A of the second wire 52 may be coupled with the second coupling part 30. The second end portion 50A of the second wire 52 may be inserted into the second insertion hole 31 of the second coupling part 30 and may be contacted with the second contact parts 32 and 33. The second end portion 50A of the second wire 52 may be disposed into the second insertion hole 31 and may be contacted with the third and third parts 32 and 33. Accordingly, the first wire 51 may be electrically connected with the first lead frame 12, and the second wire 52 may be electrically connected with the second lead frame 13. The second end portion 50A of the second wire 52 may be electrically connected with the first lead frame 12 of the second light emitting device 42. Accordingly, since the second wire 52 may be connected with the second lead frame 13 of the first light emitting device 41 and the first lead frame 12 of the second light emitting device 42, the second wire 52 may be electrically connected between the first and second light emitting devices 41 and 42.

The first and second coupling parts 20 and 30 may be located higher than the bottom surface 6 of the body 11. Both ends of the wires 51, 52, and 53 may be located lower than the bottom surface 6 of the body 11. At least one of the first and second coupling parts 20 and 30 may not protrude beyond the surface of the body 11.

The first and second light emitting devices 41 and 42 may be connected with each other through the first to third wires 51, 52, and 53. In addition, the first and second light emitting devices 41 and 45 may be connected with each other by one wire or a plurality of wires, but the embodiment is not limited thereto. Since the light emitting devices 41 and 42 may be directly connected with each other through the wires 51, 52, and 53, an additional circuit board may not be used.

The first and second wires 51 and 52 include locking grooves 51-1 and 52-2, and the locking grooves 51-1 and 52-2 may be formed in a concave-convex structure corresponding to the depths of the insertion holes 21 and 31 of the first and second light emitting devices 41 or contacting the first contact parts 22 and 23 and the second contact parts 32 and 33.

The first end portion of the first wire 51 may be inserted into the first insertion hole 21 of the first coupling part 20 of the first light emitting device 41 and the first and second parts 22 and 23 may be contacted with the locking groove 51-1. The second end portion 50A of the second wire 52 may be between the third and fourth parts 32 and 33. The second end portion 50A of the second wire 52 may be inserted into the second insertion hole 31 of the second coupling part 30 of the second light emitting device 42, and the locking groove 52-1 may be contacted with the third and fourth parts 32 and 33.

The second wire 52 may be disposed higher than the bottom surfaces of the first and second light emitting devices 41 and 42. In addition, a cover may be disposed around the second wire 52, and the electrical current leakage can be prevented due to the cover of the second wire 52. The first and second wires 51 and 52 may be located higher than the bottom surfaces of the first and second lead frames 12 and 13. Accordingly, even if portions of the first and second wires 51 and 52 are sagged, an electrical problem may be prevented.

As shown in FIGS. 3 and 4, the first to fourth parts 22, 23, 32, and 33 may have a semi-spherical shape or a polygonal shape when viewed from the lateral side of each of the light emitting devices 41 and 42. As shown in FIG. 3, the first and second parts 22 and 23 may be exposed to the first lateral sides 1 of the body 11 and may be spaced apart from each other. As shown in FIG. 4, the third and fourth parts 32 and 33 may be exposed to the second lateral side 2 of the body 11 and may be spaced apart from each other. The first and second insertion holes 21 and 31 into which the wires 51, 52, and 53 are inserted may have circular or polygonal entrances, but the embodiment is not limited thereto. The entrances of the first and second insertion holes 21 and 31 may be greater than the diameters of the wires 51, 52, and 53, but the embodiment is not limited thereto.

The wires 51, 52, and 53 may have circular side sectional surfaces. In addition, the wires 51, 52, and 53 may have different polygonal shapes, but the embodiment is not limited thereto. The wires 51, 52, and 53 may include a flexible material, but the embodiment is not limited thereto. In addition, one end portion or both end portion of the wires 51, 52, and 53 may have a ball shape or an angled shape for the coupling with each of the coupling parts 20 and 30, but the embodiment is not limited thereto.

The length of the second wire 52 may be longer than the distance between the first and second light emitting devices 41 and 42. The position of the second wire 52 disposed between the first and second light emitting devices 41 and 42 may be located higher than the bottom surfaces of the light emitting devices 41 and 42, or may be lower than or higher than the top surfaces of the light emitting devices 41 and 42. When the distance between the first and second light emitting devices 41 and 42 may be increased, a support may be further disposed between the first and second light emitting devices 41 and 42 in order to prevent the second wire 52 from being sagged, but the embodiment is not limited thereto.

The first and second light emitting devices 41 and 42 may be connected with each other in series by the wires 51, 52, and 53. According to another example, in the structure of FIG. 1, the first and second light emitting devices 41 and 42 may be connected with each other in parallel by a wire while the third lateral side 3 of the first light emitting device 41 facing the fourth lateral side 4 of the second light emitting device 42. For example, the first lead frames 12 of the first and second light emitting devices 41 and 42 are connected with each other by at least one wire, and the second lead frames 13 of the first and second light emitting devices 41 and 42 are connected with each other by at least one wire. Accordingly, the first and second light emitting devices 41 and 42 may be connected with each other in parallel.

In the following description of other embodiments, structures and components the same as those of the light emitting module according to the first embodiment can be understood by making reference to the first embodiment. Accordingly, for the convenience of the explanation, only the first light emitting device and wires connected with the first light emitting device will be described below.

Figure 5:
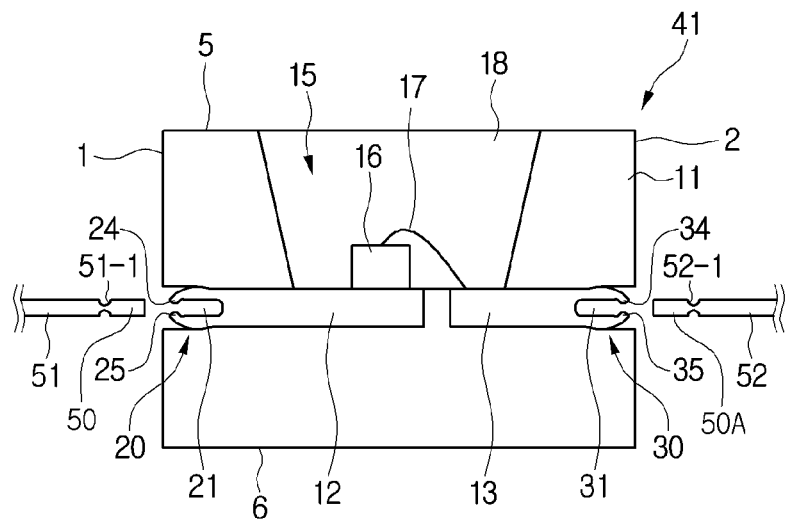
FIG. 5 is a side sectional view showing a light emitting module according to a second embodiment.

FIG. 5 is a sectional view showing a light emitting module according to a second embodiment. The light emitting module includes the wires 51, 52, and 53 to connect a plurality of light emitting devices 41 and 42 with each other as shown in FIG. 1. The light emitting module may include an insulating sheet disposed under the light emitting devices 41 and 42. Hereinafter, one light emitting device 41 and the wires 51 and 52 connected with the light emitting device 41 will be described. In the following description referring to FIG. 5, the structures and the components the same as those of the light emitting module according to the first embodiment can be understood by making reference to the first embodiment.

Referring to FIG. 5, the light emitting device 41 includes the first coupling part 20 of the first lead frame 12 and the second coupling part 30 of the second lead frame 13, and the first coupling part 20 includes the first insertion hole 21 and the first contact parts 24 and 25 disposed around the first insertion hole 21. The second coupling part 30 includes the second insertion hole 31 and the second contact parts 34 and 35 disposed around the second insertion hole 31. The first contact parts 24 and 25 include at least two parts such as the first and second parts 24 and 25. The second contact parts 34 and 35 include at least two parts such as the third and fourth parts 34 and 35.

The first contact parts 24 and 25 and the second contact parts 34 and 35 may include elastic members. For example, the first contact parts 24 and 25 and the second contact parts 34 and 35 may include an elastic member. The elastic members may adjust the distance between the first and second parts 24 and 25 and the distance between the third and fourth parts 34 and 35 after the first and second coupling parts 20 and 30 have been fabricated. The elastic members of the first to fourth parts 24, 25, 34, and 35 may provide elasticity into the insertion holes 21 and 31.

The elastic members may be formed at outer end portions of the first to fourth parts 24, 25, 34, and 35. For example, the elastic members of the first to fourth parts 24, 25, 34, and 35 may be disposed corresponding to the entrance of the first insertion hole 21. The first wire 51 may be inserted into the first insertion hole 21, and the first and second parts 24 and 25 are disposed around the first wire 51. The elastic member presses the surface of the first wire 51.

The elastic members of the third and fourth parts 34 and 35 may be formed corresponding to the entrance of the second insertion hole 31. The second wire 52 may be inserted into the second insertion hole 31, and the third and fourth parts 34 and 35 are disposed around the second wire 52. The elastic members press the surface of the end portion of the second wire 52.

Portions of the first and second parts 24 and 25, that is, the elastic members may be spaced apart from the body 11. Portions of the third and fourth parts 34 and 35, that is, the elastic members may be spaced apart from the body 11. According to another embodiment, the elastic members may be disposed at one of the first and second parts 24 and 25, and at one of the third and fourth parts 34 and 35.

The distance between the elastic members of the first and second parts 24 and 25 may be smaller than the height of the first insertion hole 21. The distance between the elastic members of the third and fourth parts 34 and 35 may be smaller than the height of the second insertion hole 31. The first and second parts 24 and 25 may have a hemi-spherical outline, and the third and fourth parts 34 and 35 may have a hemi-spherical outline.

The first and second wires 51 and 52 include the locking grooves 51-1 and 52-1, and the locking grooves 51-1 and 52-1 are disposed in the first and second insertion holes 21 and 31. The first and second wires 51 and 52 may be contacted with the first to fourth parts 24, 25, 34, and 35, and the locking grooves 51-1 and 52-1 may be contacted with the elastic members of the first to fourth parts 24, 25, 34, and 35.

Since the first and second coupling parts 20 and 30 have the elastic members, the first and second wires 51 and 52 can be easily inserted into the first and second coupling parts 20 and 30 or separated from the first and second coupling parts 20 and 30.

Figure 6:
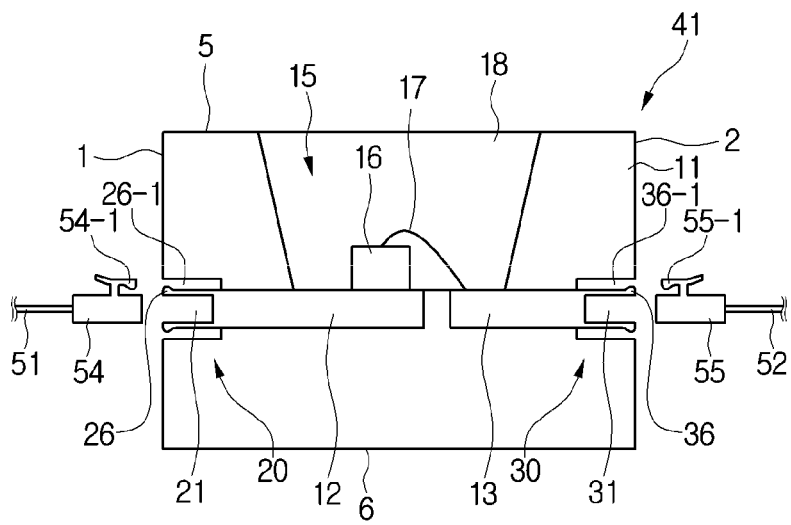
FIG. 6 is a side sectional view showing a light emitting module according to a third embodiment.

FIG. 6 is a sectional view showing a light emitting module according to a third embodiment. The light emitting module includes a plurality of light emitting devices 41 and 42 and the wires 51, 52, and 53 to connect the light emitting devices 41 and 42 with each other as shown in FIG. 1. The light emitting module may include an insulating sheet disposed under the light emitting devices 41 and 42. In the following description referring to FIG. 6, the structures and the components the same as those of the first embodiment can be understood by making reference to the first embodiment, and the coupling example between the light emitting device 41 and the wire according to the third embodiment will be described.

Referring to FIG. 6, the light emitting device 41 includes the first coupling part 20 extending from the first lead frame 12 and the second coupling part 30 extending from the second lead frame 13. The light emitting device 41 includes the first and second wires 51 and 52 connected with the first and second coupling parts 20 and 30.

The first coupling part 20 of the light emitting device 41 may include a socket structure having the first insertion hole 21. The first coupling part 20 includes the first insertion hole 21, a first contact member 26, and a first guide groove 26-1. The first contact member 26 branches from the first lead frame 12. A plurality of contact members 26 may branch into mutually different regions from the first lead frame 12. The first contact members 26 may be disposed around the first insertion hole 21. The first contact member 26 may be disposed between the first insertion hole 21 and the first guide groove 26-1. The first contact members 26 may include a locking protrusion coupled with the elastic member 54-1 of the wire 51. The first insertion hole 21 may have a depth different from that of the first guide groove 26-1, but the embodiment is not limited thereto.

The second coupling part 30 may include a socket structure having the second insertion hole 31. The second coupling part 30 includes the second insertion hole 31, a second contact member 36, and a second guide groove 36-1. The second contact member 36 may branch from the second lead frame 13. A plurality of second contact members 36 may branch from the second lead frame 13 to mutually different regions. The second contact members 36 may be disposed around the second insertion hole 31. The second contact members 36 may be disposed between the second insertion hole 31 and the second guide groove 36-1. The second contact member 36 may include a locking protrusion locked with the elastic member 55-1 of the wire 52. The second insertion hole 31 may have a depth different from that of the second guide groove 36-1, but the embodiment is not limited thereto.

The wires 51 and 52 are coupled with the first and second coupling parts 20 and 30. The wires 51 and 52 include head parts 54 and 55 and elastic members 54-1 and 55-1 formed at the head parts 54 and 55. The diameters or the thicknesses of the head parts 54 and 55 may be greater than those of the wires 51 and 52. The head parts 54 and 55 of each of wires 51 and 52 may be inserted into the first and second insertion holes 21 and 31.

The first and second coupling parts 20 and 30 may be formed in a female socket structure. The head parts 54 and 55 of the wires 51 and 52 are inserted into the insertion holes 21 and 31 of the coupling parts 20 and 30, respectively. The head parts 54 and 55 of the wires 51 and 52 may be contacted with the contact members 26 and 36 of the first and second coupling parts 20 and 30.

In addition, the elastic members 54-1 and 55-1 protruding from the head parts 54 and 55 of the wires 51 and 52 are locked with the protrusions of the first and second contact members 26 and 36. Since the elastic members 54-1 and 55-1 and the first and second contact members 26 and 36 have a locking coupling structure, the elastic members 54-1 and 55-1 can be coupled with the first and second contact members 26 and 36. The head parts 54 and 55 of the wires 51 and 52 constitute end portions.

Figure 7:
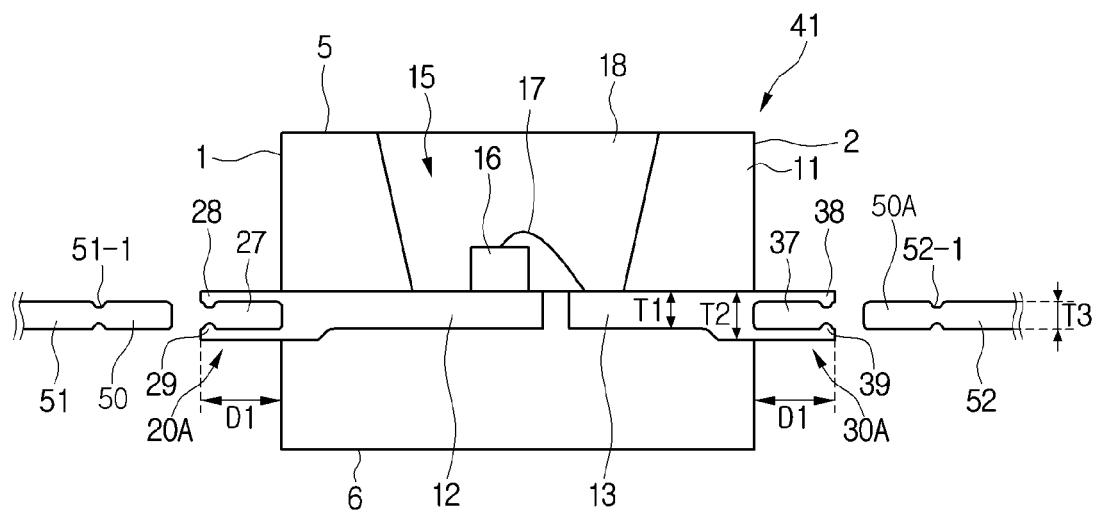
FIG. 7 is a side sectional view showing a light emitting module according to a fourth embodiment.

FIG. 7 is a sectional view showing a light emitting module according to a fourth embodiment. The light emitting module includes a plurality of light emitting devices 41 and 42 and the wires 51, 52, and 53 to connect the light emitting devices 41 and 42 with each other as shown in FIG. 1. The light emitting module may include an insulating sheet disposed under the light emitting devices 41 and 42. In the following description referring to FIG. 7, the structures and the components the same as those of the first embodiment can be understood by making reference to the first embodiment, and the coupling example between the light emitting device and the wire according to the fourth embodiment will be described.

Referring to FIG. 7, a first coupling part 20A of the light emitting device 41 protrudes outward from the first lateral side 1 of the body 11, and a second coupling part 30A protrudes outward from the second lateral side 2 of the body 11. The protrusion length D1 of the first and second coupling parts 20A and 30A may be varied depending on positions of the locking grooves 51-1 and 52-1, but the embodiment is not limited thereto.

The first coupling part 20A includes a first insertion hole 27 and first and second contact members 28 and 29, and the first end portion 50 of the first wire 51 may be inserted into the first insertion hole 27 of the first coupling part 20A to contact the first and second contact members 28 and 29.

The second coupling part 30A includes a second insertion hole 37 and third and fourth contact members 38 and 39, and the second end portion 50A of the second wire 52 may be inserted into the second insertion hole 37 of the second coupling part 30A to contact the third and fourth contact members 38 and 39.

Thicknesses T1 of portions of the first and second lead frames 12 and 13, which are disposed in the body 11, may be thinner than thicknesses T2 of the first and second coupling parts 20A and 30A. According to another example, the thickness T1 may be equal to the thickness T2.

The thicknesses T2 of portions of the first and second coupling parts 20A and 30A disposed in the body 11 may be equal to or different from the thicknesses of portions of the first and second coupling parts 20A and 30A exposed to the outside of the body 11. In addition, the thicknesses T2 of portions of the first and second coupling parts 20A and 30A disposed in the body 11 may be equal to the thicknesses T1 of portions of the first and second lead frames 12 and 13 disposed in the body 11. The diameters T3 of the wires 51 and 52 may be smaller than the thicknesses T2 of the first and second coupling parts 20A and 30A, but the embodiment is not limited thereto. In the diameters T3 of the wires 51 and 52, the diameter of each of the end portions 50 and 50A may be greater than the depth of each of the locking grooves 51-1 and 52-1, or the diameter of another portion in the wires 51 and 52. The diameters T3 of the wires 51 and 52 may be equal to or greater than the diameter of the connection member 17.

Figure 8:
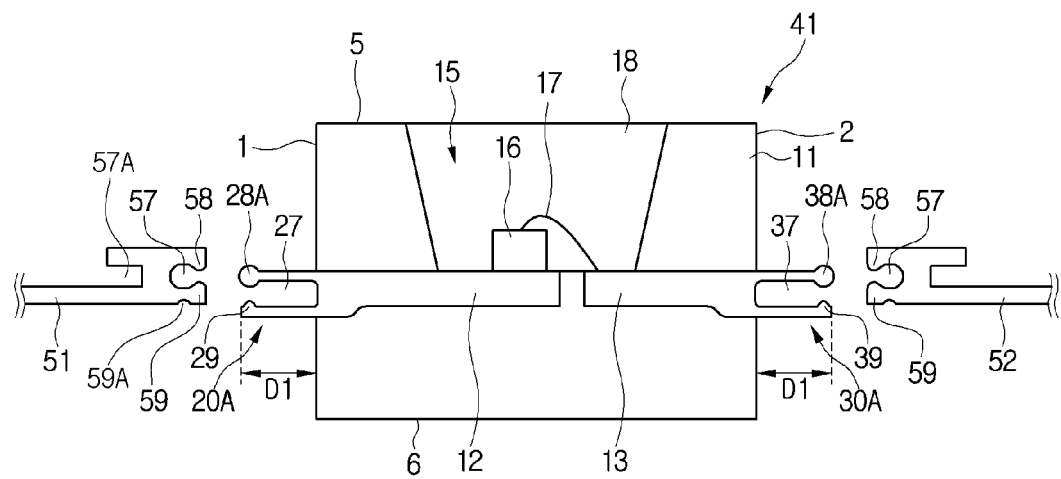
FIG. 8 is a side sectional view showing a light emitting module according to a fifth embodiment.

FIG. 8 is a sectional view showing a light emitting module according to a fifth embodiment. In the following description referring to FIG. 8, the structures and the components the same as those of the first embodiment can be understood by making reference to the first embodiment, and the coupling example between the light emitting device 41 and the wire according to the fifth embodiment will be described.

Referring to FIG. 8, the first coupling part 20A of the light emitting device 41 protrudes outward from the first lateral side 1 of the body 11, the second coupling part 30A protrudes outward from the second lateral side 2 of the body 11, and a socket structure may be formed in a head part 59 of the first and second wires 51 and 52.

The first coupling part 20 includes first insertion hole 27 and first and second contact members 28A and 29, and the head part 59 of the first wire 51 is inserted into the first insertion hole 27 of the first coupling part 20 and may be contacted with the first and second contact members 28A and 29. In this case, the head part 59 of the first wire 51 includes a groove 57 and an elastic member 58, the first contact member 28A may be inserted into the groove 57, and the elastic member 58 may be contacted with a top surface of the first contact member 28A. In this case, an end portion of the first contact member 28A and the groove 57 may have a spherical shape, but the embodiment is not limited thereto.

The second coupling part 30A includes a second insertion hole 37 and first and second contact members 38A and 39. A head part 59 of the second wire 52 performs a coupling operation together with the first wire 51, and the details thereof will be omitted. End portions of the first and second wires 51 and 52 may be coupled with the coupling parts 20A and 30A of the light emitting device 41 through the head part 59 having a socket structure. The head part 59 and the coupling parts 20A and 30A may be coupled with each other through female/male socket structures. Recesses 59A that are concave may be formed in bottom surfaces of the head parts 59. The second contact members 29 and 39 of the wires 51 and 52 may be inserted into the recesses 59A. The head parts 59 of the first and second wires 51 and 52 may constitute the end portion of the head part 59.

Figure 9:
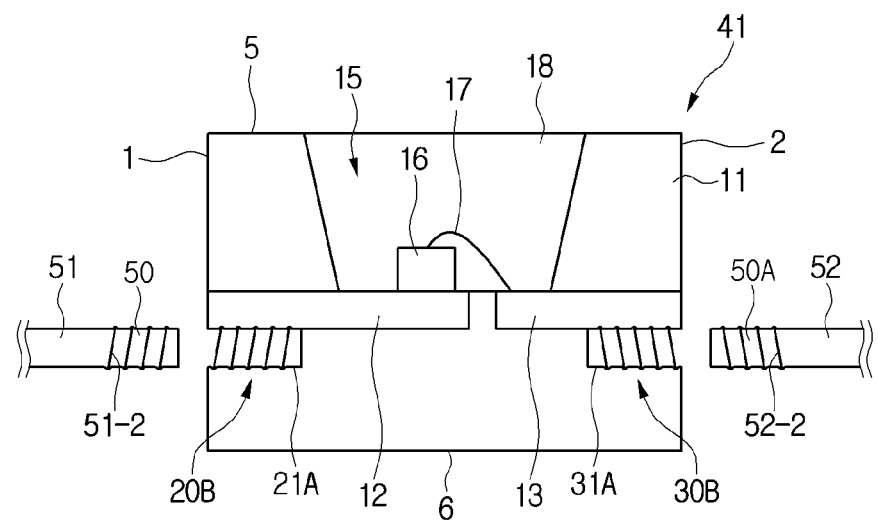
FIG. 9 is a side sectional view showing a light emitting module according to a sixth embodiment.

FIG. 9 is a sectional view showing a light emitting module according to a sixth embodiment. In the following description referring to FIG. 9, the structures and the components the same as those of the first embodiment can be understood by making reference to the first embodiment, and the coupling example between the light emitting device 41 and the wire according to the sixth embodiment will be described.

Referring to FIG. 9, the light emitting device 41 includes first and second coupling parts 20B and 30B having spiral grooves 21A and 31A in the body 11. The first and second coupling parts 20B and 30B may be disposed therein with the spiral grooves 21A and 31A that are insertion holes, and screw lines 51-2 and 52-2 may be formed on both end portions 50 and 50A of the first and second wires 51 and 52, respectively.

The spiral grooves 21A and 31A may be formed at a predetermined depth along at least one of bottom and top surfaces of the first and second lead frames 12 and 13, and the screw lines 51-2 and 52-2 may be formed in a spiral structure corresponding to that of the spiral grooves 21A and 31A.

For example, the screw lines 51-2 and 52-2 of the first and second wires 51 and 52 may be formed at the end portions 50 and 50A of the first and second wires 51 and 52, or may be formed at the entire regions of the first and second wires 51 and 52. The screw lines 51-2 and 52-2 of the first and second wires 51 and 52 are coupled with the spiral grooves 21A and 31A of the first and second coupling parts 20B and 30B, so that the first and second wires 51 and 52 may be contacted with the first and second lead frames 12 and 13.

In this case, the rotational directions of the screw lines 51-2 and 52-2 may be the same as the rotational directions of the spiral grooves 21A and 31A. In this case, when the wires 51 and 52 are coupled with the first and second coupling parts 20B and 30B of the light emitting device 41, the rotational directions of the screw lines 51-2 and 52-2 may be the same as the rotational directions of the spiral grooves 21A and 31A, so that the wires 51 and 52 are not distorted due to the rotational directions of the screw lines 51-2 and 52-2 and the spiral grooves 21A and 31A.

Figure 10:
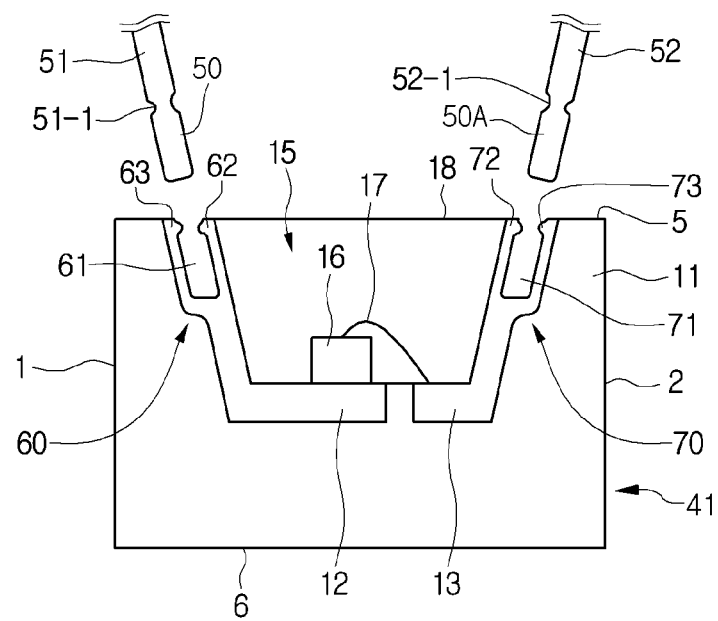
FIG. 10 is a side sectional view showing a light emitting module according to a seventh embodiment.

FIG. 10 is a sectional view showing a light emitting module according to a seventh embodiment. In the following description referring to FIG. 10, the structures and the components the same as those of the first embodiment can be understood by making reference to the first embodiment, and the coupling example between the light emitting device 41 and the wire according to the seventh embodiment will be described.

Referring to FIG. 10, the light emitting device 41 includes first and second coupling parts 60 and 70 exposed to a top surface 5 of the body 10. The first coupling part 60 may be formed at a part bent toward the top surface 5 of the body 10 from the first lead frame 12 and the second coupling part 70 may be formed at a part bent toward the top surface 5 of the body 10 from the second lead frame 13.

The part bent from the first lead frame 12 may be exposed to at least one lateral side of the cavity 15 of the body 10. The part bent from the second lead frame 13 may be exposed to at least one lateral side of the cavity 15 of the body 10. The parts bent from the first and second lead frames 12 and 13 are arranged at lateral sides of the cavity 15, so that the light extraction efficiency can be improved.

The first coupling part 60 may be disposed at the parts bent from the first lead frame 12 and exposed to the top surface 5 of the body 11. The first coupling part 60 includes first insertion hole 61, and first and second contact members 62 and 63. The first end portion 50 of the first wire 51 may be inserted into the first insertion hole 61 of the first coupling part 60 through an upper portion of the body 11 while being contacted with the first and second contact members 62 and 63. Accordingly, the first end portion 50 of the first wire 51 may be coupled with the first coupling part 60 of the first lead frame 12. The first coupling part 60 may be formed in the shape of a female connector, but the embodiment is not limited thereto.

The second coupling part 70 may be disposed at the parts bent from the second lead frame 13 and exposed to the top surface 5 of the body 11. The second coupling part 70 includes second insertion hole 71, and third and fourth contact members 72 and 73. The second end portion 50A of the second wire 52 may be inserted into the second insertion hole 71 of the second coupling part 70 through an upper portion of the body 11 while being contacted with the third and fourth contact members 72 and 73. Accordingly, the second end portion 50A of the second wire 52 may be coupled with the second coupling part 70 of the second lead frame 13. The second coupling part 70 may be formed in the shape of a female connector, but the embodiment is not limited thereto.

The first coupling part 60 may be disposed on a portion of the top surface 5 of the body 11 adjacent to the first lateral side 1. For example, the first coupling part 60 may be disposed between the first lateral side 1 of the body 1 and the cavity 15. The second coupling part 70 may be disposed on a portion of the top surface 5 of the body 11 adjacent to the second lateral side 2. For example, the second coupling part 70 may be disposed between the second lateral side of the body 11 and the cavity 15.

The extension directions of the first insertion hole 61 of the first coupling part 60 and the second insertion hole 71 of the second coupling part 70 may be directions perpendicular to the top surface of the body 11 or inclined with respect to the top surface of the body 11. In this case, if the extension directions of the first and second insertion holes 61 and 71 are the inclined directions, the lengths of the wires 51 and 52 may be reduced.

The first and second coupling parts 60 and 70 may be disposed at both lateral sides of the cavity 15 to reflect incident light.

Figure 11:
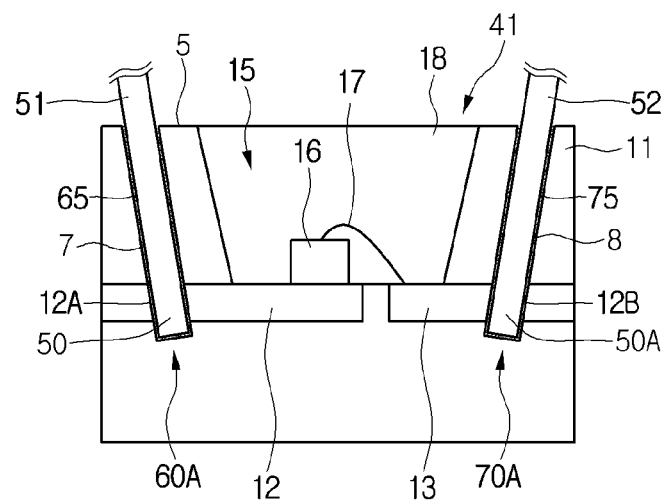
FIG. 11 is a side sectional view showing a light emitting module according to an eighth embodiment.

FIG. 11 is a sectional view showing a light emitting module according to an eighth embodiment. In the following description referring to FIG. 11, the structures and the components the same as those of the first embodiment can be understood by making reference to the first embodiment, and the coupling example between the light emitting device 41 and the wire according to the eighth embodiment will be described.

Referring to FIG. 1, the light emitting module includes a first wire 51 coupled with a first coupling part 60A of the light emitting device 41 and a second wire 52 coupled with the second coupling part 70A.

The first coupling part 60A includes a first insertion hole 65 having a predetermined depth from the top surface 5 of the body 11 to the first lead frame 12. The first insertion hole 65 may be formed in the body 11 and a first lead frame 12. The first end portion 50A of the first wire 51 may be inserted into the first insertion hole 65 of the first coupling part 60A, and the first end portion 50 of the first wire 51 may be contacted with a contact hole 12A of the first lead frame 12. If the width of the first insertion hole 65 is greater than the diameter of the first wire 51, a conductive paste 7 may be coated on the surface of the first end portion 50 of the first wire 51 and then the first end portion 50 may be inserted into the first insertion hole 65. The first wire 51 and the conductive paste 7 may be contacted with the first lead frame 12 in the contact hole 12A of the first lead frame 12. Accordingly, the first end portion 50 of the first wire 51 may be electrically connected with the first coupling part 60A of the first lead frame 12.

The second coupling part 70A includes a second insertion hole 75 having a predetermined depth from the top surface 5 of the body 11 to the second lead frame 13. The second insertion hole 75 may be formed in the body 11 and the second lead frame 13. The second end portion 50A of the second wire 52 may be coupled with the second coupling part 70A. A conductive paste 8 may be coated on the surface of the second end portion 50A of the second wire 52, and the second wire 52 and the conductive paste 8 may be contacted with a contact hole 12B of the second lead frame 13. Accordingly, the second end portion 50A of the second wire 52 may be electrically connected to the second lead frame 13.

The extension directions of the first and second coupling parts 60A and 70A may be directions perpendicular to the top surface 5 of the body 11 or inclined with respect to the top surface 5 of the body 11.

Figure 12:
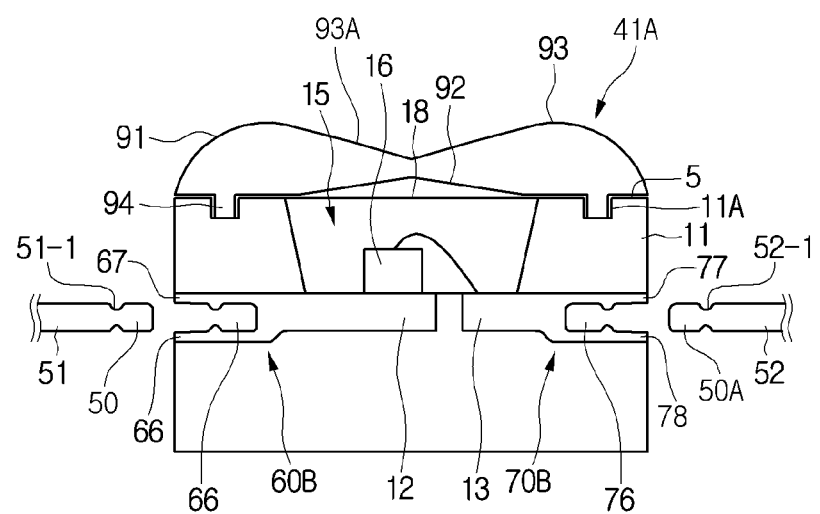
FIG. 12 is a side sectional view showing a light emitting module according to a ninth embodiment.

FIG. 12 is a sectional view showing a light emitting module according to a ninth embodiment. In the following description referring to FIG. 12, the structures and the components the same as those of the first embodiment can be understood by making reference to the first embodiment, and the coupling example between the light emitting device 41 and the wire according to the ninth embodiment will be described.

Referring to FIG. 12, in each light emitting device 41A of a light emitting module, an optical lens 91 may be coupled with an upper portion of the light emitting device 41A, the first end portion 50 of the first wire 51 may be coupled with a first coupling part 60B of the first lead frame 12, and a second wire 52 may be coupled with a second coupling part 70B of the second lead frame 13. The first and second coupling parts 60B and 70B include insertion holes 66 and 76 and contact members 67, 68, 77, and 78, and the coupling structure of the coupling parts 60B and 70B and the wires 51 and 52 may be understood by making reference to the description with reference to the first embodiment.

The optical lens 91 receives light emitted from the light emitting chip 16 and refracts the light in a different direction. The optical lens 91 includes a recess 91 formed at a light incident part and a concave part 93A formed at a light exit part 93. The recess 92 may be formed in the shape convex in a direction gradually distanced from the top surface of the molding member 18, and the concave part 94A may be formed in the shape convex in a direction gradually approaching the light emitting chip 16.

The optical lens 91 diffuses the light incident into the recess 92 of the light incident part, and the concave part 93A reflects the incident light to the light exit part 93 in a side direction. Accordingly, the optical lens 91 may reflect the incident light in the side direction, but the embodiment is not limited thereto.

The optical lens 91 is disposed at a lower portion thereof with a plurality of coupling protrusions 94, and the coupling protrusions 94 may be coupled with a coupling structure 11A of the body 11 of the light emitting device 41A. The coupling structure 11A includes a groove structure or a step structure. In addition, the lower portion of the optical lens 91 may be attached to the top surface 5 of the body 11 through an adhesion member.

Figure 13:
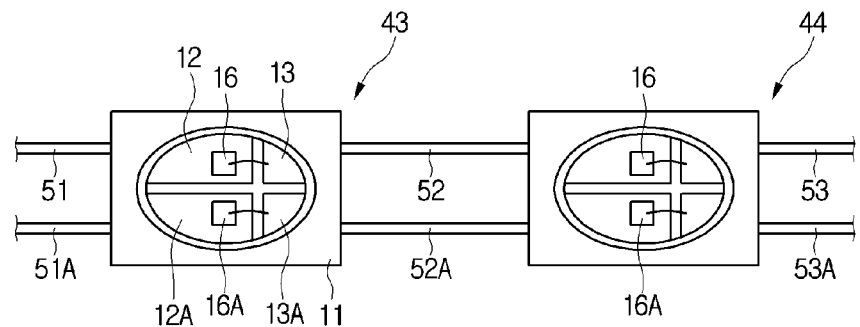
FIG. 13 is a side sectional view showing a light emitting module according to a tenth embodiment.

FIG. 13 is a sectional view showing a light emitting module according to a tenth embodiment. In the following description referring to FIG. 13, the structures and the components the same as those of the first embodiment can be understood by making reference to the first embodiment, and the coupling example between the light emitting device 41 and the wire according to the tenth embodiment will be described.

Referring to FIG. 13, a light emitting module includes a plurality of light emitting devices 43 and 44 having a plurality of light emitting chips 16 and 16A and wires 51, 52, 53, 51A, 52A, and 53A coupled with coupling parts of the light emitting devices 43 and 44.

Each of the light emitting devices 43 and 44 includes a plurality of lead frames 12, 13, 12A, and 13A and a plurality of light emitting chips 16 and 16A disposed in a body 11. The lead frames 12, 13, 12A, and 13A include first to fourth lead frames 12, 13, 12A, and 13A. The light emitting chip 16 and 16A may be mounted on the first and third lead frames 12 and 12A.

A plurality of wires 52 and 52A may be disposed between two adjacent light emitting devices 43 and 44. The coupling parts disclosed in the embodiments may be formed on the first to fourth lead frames 12, 13, 12A, and 13A, respectively. The end portions of the wires 51, 52, 53, 51A, 52A, and 53A may be inserted into the coupling parts and coupled with the coupling parts. Accordingly, the wires 51, 52, 53, 51A, 52A, and 53A connect two adjacent light emitting devices 43 and 44 with each other. For example, the wires 51, 52, 53, 51A, 52A, and 53A connect the two adjacent light emitting devices 43 and 44 in parallel.

FIGS. 14A and 14B show a first modification of coupling parts and end portions of wires in a light emitting device.

Figure 14:
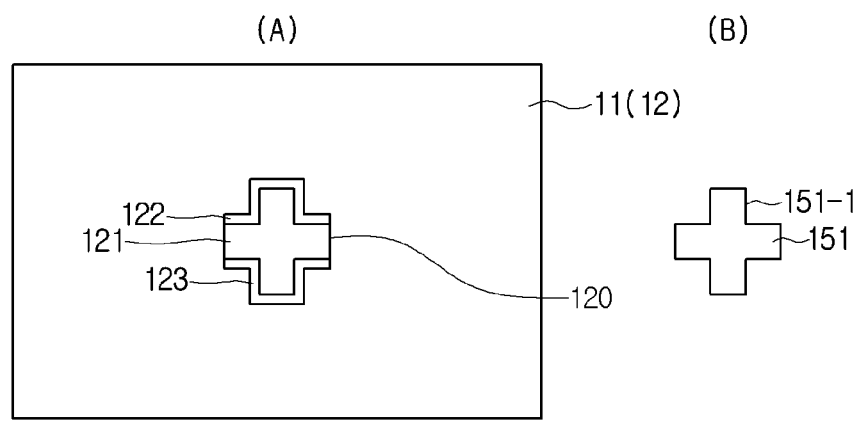
FIGS. 14A and 14B show a first modification of coupling parts and end portions of wires in a light emitting device.

Referring to FIG. 14, a coupling part 120 of the light emitting device includes an insertion hole 121 having a cross shape and first and second contact members 122 and 123 defined by the insertion hole 121. An end portion 151-1 of the wire 151 may be formed in a cross shape corresponding to the shape of the insertion hole 121 having the cross shape. According to another example, the coupling part 120 and an end portion 151-1 of the wire 151 may have a polygonal shape, an oval shape, and a shape having the mixture of an angular surface and a curved surface, but the embodiment is not limited thereto.

FIGS. 15A and 15B show a second modification of coupling parts and end portions of wires in a light emitting device.

Figure 15:
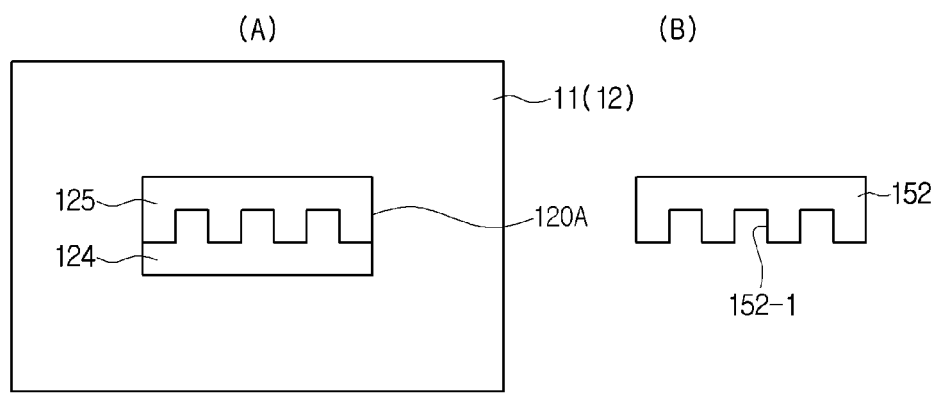
FIGS. 15A and 15B show a second modification of coupling parts and end portions of wires in a light emitting device.

Referring to FIG. 15, a coupling part 120A of the light emitting device includes an insertion hole 125 and a contact member 124 having a concave-convex structure defined by the insertion hole 125. An end portion 152-1 of the wire 152 may be formed in a concave-convex shape so that the end portion 152-1 of the wire 152 may be inserted into the insertion hole 125. The concave-convex structure may increase the contact area between the coupling part 120A and the end portion of the wire 152.

The end portions 151-1 and 152-1 of the wires 151 and 152 disclosed in FIGS. 14 and 15 may have widths wider than diameters of the wires 51 and 52 according to the embodiment, and may be formed in the shape different from a circular shape, but the embodiment is not limited thereto.

Figure 16:
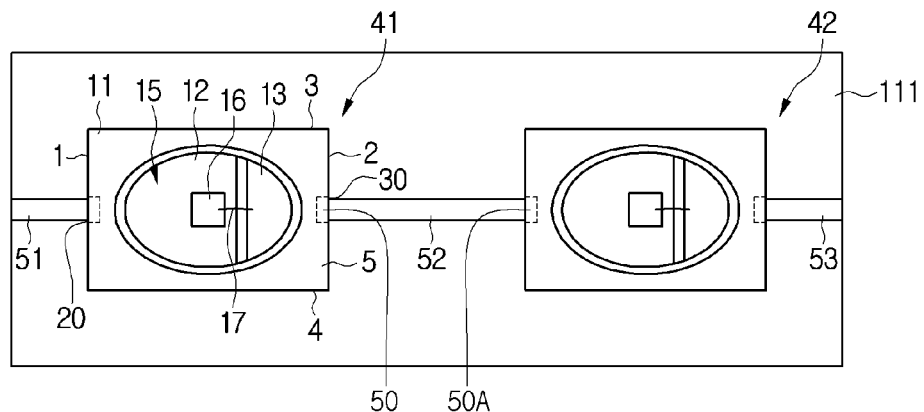
FIG. 16 is a view showing an example in which an insulating sheet is provided under the light emitting module of FIG. 1.

FIG. 16 is a view showing an example in which an insulating sheet is disposed under the light emitting module of FIG. 1.

Referring to FIG. 16, a plurality of light emitting devices 41 and 42 are attached to the insulating sheet 111, and the light emitting devices 41 and 42 may be connected to each other through the wires 51, 52, and 53 according to the embodiment.

The insulating sheet 111 includes a bonding sheet. For example, the insulating sheet 111 may include a plurality of bonding layers, and for example, may include a first bonding layer (not shown) and a second bonding layer (not shown) under the first bonding layer. The light emitting devices 41 and 42 are bonded to the first bonding layer while being spaced apart from each other by a predetermined distance, and the second bonding layer may be bonded to another target or another bottom cover. After arranging the light emitting devices 41 and 42 on the insulating sheet 111, the light emitting devices 41 and 42 are connected with each other by the wires 51, 52, and 53, so that an additional circuit board may not be used.

The wires 51, 52, and 53 according to the embodiment may be located higher than the insulating sheet 111, or may be spaced apart from the insulating sheet 111 so that the wires 51, 52, and 53 may not be contacted with the insulating sheet 111. At least one of a plurality of coupling parts according to the embodiment may be exposed to at least one of a lateral side and a top surface of the body or may protrude from the at least one of the lateral side and the top surface of the body.

<Lighting System>

The light emitting device according to the embodiment may be applied to a lighting system. The lighting system has a structure in a plurality of light emitting devices are arrayed. The lighting system may include a display device as shown in FIGS. 17 and 18 and may include a lighting lamp, a signal lamp, a headlight of a vehicle, and an electric signboard.

Figure 17:
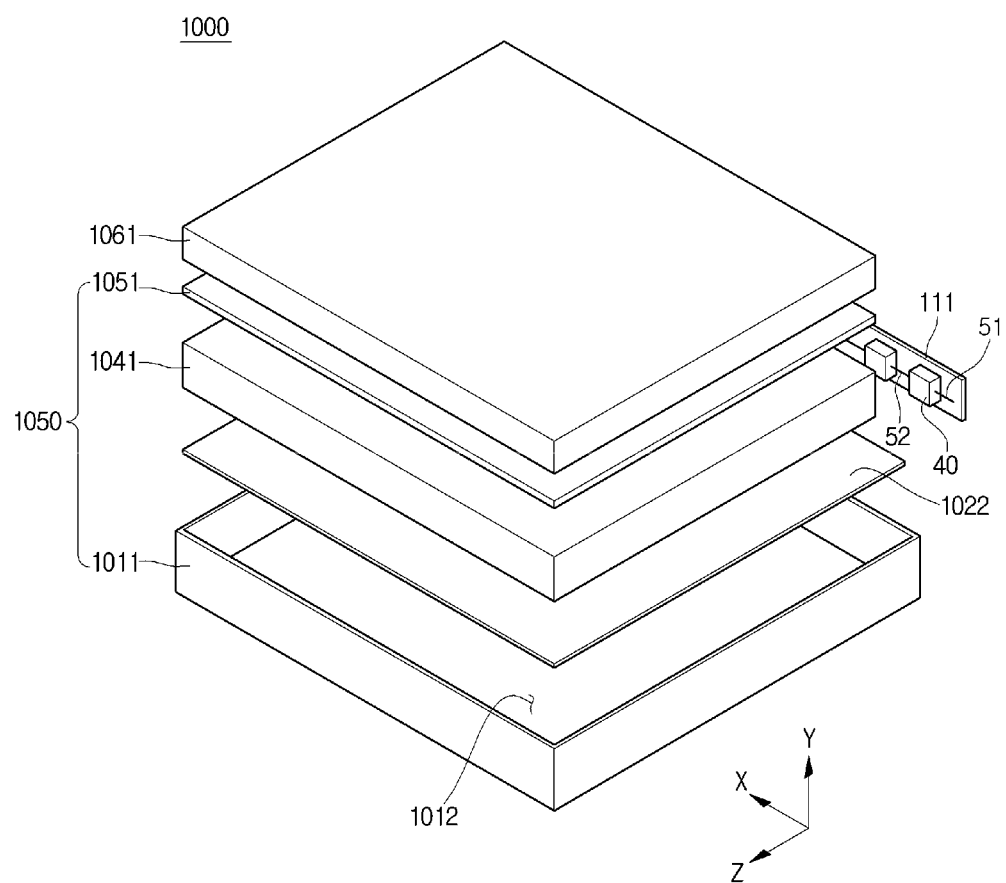
FIG. 17 is an exploded perspective view showing a display device the light emitting module shown in FIG. 16.
Figure 18:
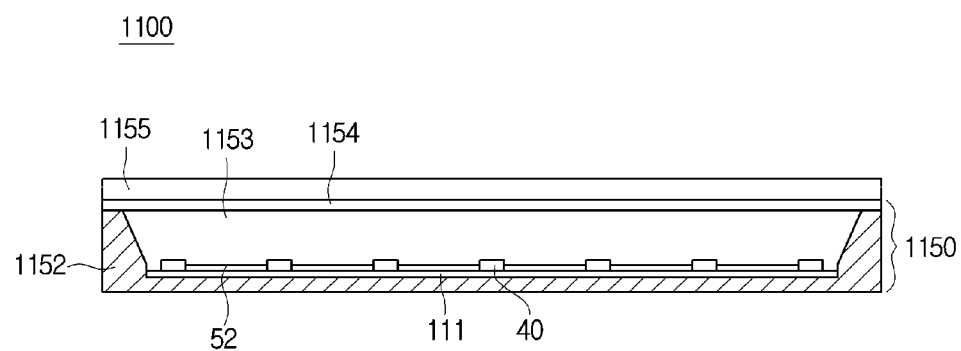
FIG. 18 is a view showing the display device having the light emitting module shown in FIG. 16.

FIG. 17 is an exploded perspective view showing a display device 1000 having the light emitting device according to the embodiment.

Referring to FIG. 17, the display device 1000 according to the embodiment may include a light guide plate 1041, a light emitting device 40 to supply the light to the light guide plate 1041, the insulating sheet 111 that light emitting devices 40 are attached to, the wires 51 and 52 connecting the light emitting devices 40 with each other, a reflective member 1022 disposed below the light guide plate 1041, an optical sheet 1051 disposed above the light guide plate 1041, a display panel 1061 disposed above the optical sheet 1051, and a bottom cover 1011 to receive the light guide plate 1041, a light emitting module 1031, and the reflective member 1022, but the embodiment is not limited thereto.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting device 40 supplies the light to at least one side of the light guide plate 1041. The light emitting module 1031 serves as the light source of the display device. The light emitting device 40 may directly or indirectly supply the light to the at least one side of the light guide plate 1041.

The light emitting devices 40 are connected with each other by the wires 51 and 52 disclosed in the embodiment, and attached to the insulating sheet 111. The insulating sheet 111 may be bonded to at least one of internal lateral sides of the bottom cover 1011.

In addition, a plurality of light emitting devices 40 may be spaced apart from the light guide plate 1041 by a predetermined distance, but the embodiment is not limited thereto. The light emitting device 40 may directly or indirectly supply light to a light incident part which is one lateral side thereof, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of a light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the support sheet 111, and the reflective member 1022 therein. To this end, the bottom cover 1011 has a receiving part 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other and include a transparent material, and a liquid crystal layer disposed between the first and second substrates. A polarizing plate can be attached to at least one surface of the display panel 1061, but the embodiment is not limited thereto. The display panel 1061 displays information by light passing through an optical sheet 1051. The display apparatus 1000 can be applied to various portable terminals, monitors of notebook computers, monitors or laptop computers, and televisions.

The optical sheet 1051 may be disposed between the display panel 1061 and the light guide plate 1041 and includes at least one transmissive sheet. For example, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel, and the brightness enhanced sheet improves the brightness by reusing the lost light. In addition, a protective sheet may be disposed on the display panel 1061, but the embodiment is not limited thereto.

FIG. 18 is a view showing the display device having the light emitting device according to the embodiment.

Referring to FIG. 18, the display apparatus 1100 includes a bottom cover 1152, an insulating sheet 111 on which the disclosed light emitting devices 40 are arrayed, an optical member 1154, and a display panel 1155.

The insulating sheet 111, the light emitting devices 40, and the wire to connect the light emitting devices 40 with each other may constitute a light emitting module. In addition, the bottom cover 1152, at least one light emitting module, and the optical member 1154 may constitute the light unit 1150. The bottom cover 11152 may include a receiving part 1153, but the embodiment is not limited thereto.

In this case, the optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate may be omitted. The diffusion sheet diffuses the incident light, the horizontal and vertical prism sheet concentrates the incident light onto a display region, and the brightness enhanced sheet improves the brightness by reusing the lost light.

The optical member 1154 may be disposed on the light emitting device 40. The optical member 1154 provides the light emitted from the light emitting device 40 as a surface light source, or diffuses or concentrates the light.

The embodiment may provide an individual light emitting module by bonding a plurality of light emitting devices having at least one light emitting chip packaged therein to each insulating sheet. The light emitting modules are arrayed and connected with each other by the connection member such as a wire for use thereof, so that the occupation area of a circuit board can be reduced, and the degree of freedom in the connection between the light emitting modules can be improved.

According to the embodiment, the circuit board can be omitted in each light emitting module. According to the embodiment, adjacent light emitting devices can be freely arranged. According to the embodiment, the degree of freedom in the installation of each light emitting module can be improved. According to the embodiment, the occupation area of the circuit board can be removed from the set having the light emitting device such as the light unit.

Although the embodiments have been described, it is understood that the present disclosure should not be limited to these embodiments but various changes and modifications can be made by one ordinary skilled in the art within the spirit and scope of the present disclosure as hereinafter claimed.

What is claimed is:

1. A light emitting module comprising:
a plurality of light emitting devices; and
a wire connecting the light emitting devices with each other and having at least a first end portion coupled with each light emitting device,
wherein the wire has a length longer than a distance between the light emitting devices, and is located higher than bottom surfaces of the light emitting devices,
wherein each of the plurality of light emitting devices comprises: a body including an insulating material; a first lead frame making contact with the body and having a first coupling part; a second lead frame making contact with the body and having a second coupling part; and a light emitting chip on at least one of the first and second lead frames,
the first and second coupling parts are located higher than the bottom surfaces of the light emitting devices, and
the wire is coupled with one of the first and second coupling parts of the light emitting devices.

2. The light emitting module of claim 1, wherein the first and second coupling parts are exposed to a lateral side of the body.

3. The light emitting module of claim 1, wherein each of the first and second coupling parts includes a first insertion hole, into which the first end portion of the wire is inserted, and a first contact part making contact with the first end portion of the wire.

4. The light emitting module of claim 3, wherein the first contact part comprises a plurality of parts around the first insertion hole, and the first end portion of the wire is disposed between the plurality of parts.

5. The light emitting module of claim 4, wherein the first and second lead frames are spaced apart from the bottom surfaces of the light emitting device.

6. The light emitting module of claim 1, wherein the first and second coupling parts are exposed to mutually different regions of the body.

7. The light emitting module of claim 6, wherein the wire is located higher than a bottom surface of the light emitting chip.

8. The light emitting module of claim 1, wherein each light emitting device comprises: a cavity to open an upper portion of the body; and a molding member in the cavity, and
wherein the light emitting chip and portions of the first and second lead frames are disposed in the cavity.

9. A light emitting module comprising:
a plurality of light emitting devices;
a wire connecting the light emitting devices with each other and having at least a first end portion coupled with each light emitting device; and
an insulating sheet disposed under the light emitting devices,
wherein the wire has a length longer than a distance between the light emitting devices, and is located higher than bottom surfaces of the light emitting devices,
wherein each of the plurality of light emitting device comprises: a body including an insulating material; a first lead frame making contact with the body and having a first coupling part; a second lead frame making contact with the body and having a second coupling part; and a light emitting chip disposed on at least one of the first and second lead frames,
the first and second coupling parts are located higher than the bottom surfaces of the light emitting devices, and
the wire is coupled with one of the first and second coupling parts of the light emitting devices.

10. The light emitting module of claim 9, wherein the first and second coupling parts are exposed to first and second lateral sides disposed in opposition to each other among lateral sides of the body.

11. The light emitting module of claim 9, wherein each of the first and second coupling parts comprises a first insertion hole, into which the first end portion of the wire is inserted, and a first contact part making contact with the first end portion of the wire.

12. The light emitting module of claim 9, wherein the first contact part comprises a plurality of parts around the first insertion hole, and an end portion of the wire is disposed between the parts.

13. The light emitting module of claim 9, wherein the first end portion of the wire comprises a locking groove making contact with the first contact part, and
wherein the locking groove is located at an inner region position than a lateral side of the body.

14. The light emitting module of claim 1, wherein the wire includes a flexible material between the plurality of light emitting devices.

15. The light emitting module of claim 1, wherein the wire has circular side sectional surface.

16. The light emitting module of claim 1, wherein the wire has a second end portion opposite to the first end portion,
wherein the plurality of light emitting device includes a first and second light emitting devices connected to the wire, and
wherein portion of the wire is coupled to the first coupling part of the first lead frame of the first light emitting device and the second end portion of the wire is coupled to the second coupling part of the second lead frame of the second light emitting device.

17. The light emitting module of claim 16, wherein the first coupling part has the same structures as the second coupling part.

18. The light emitting module of claim 1, further comprising an insulating sheet disposed under the plurality of light emitting devices and the wire,
wherein the bodies of the plurality of light emitting devices are attached to the insulating sheet.

19. The light emitting module of claim 9, wherein the wire includes a flexible material between the plurality of light emitting devices,
wherein the wire has a second end portion opposite to the first end portion,
wherein the plurality of light emitting device includes a first and second light emitting devices connected to the wire, and
wherein the first end portion of the wire is coupled to the first coupling part of the first lead frame of the first light emitting device and the second end portion of the wire is coupled to the second coupling part of the second lead frame of the second light emitting device.

20. The light emitting module of claim 18, wherein each light emitting device comprises:
a cavity to open an upper portion of the body; and
a molding member in the cavity, and wherein the light emitting chip and portions of the first and second lead frames are disposed in the cavity, and
wherein the first and second end portions of the wire are located at a lower position of a top surface of the each of the plurality of light emitting devices.

* * * * *